(12) United States Patent
Stay et al.

(10) Patent No.: US 11,284,521 B2
(45) Date of Patent: *Mar. 22, 2022

(54) ELECTRONIC DEVICES COMPRISING A VIA AND METHODS OF FORMING SUCH ELECTRONIC DEVICES

(71) Applicant: 3M INNOVATIVE PROPERTIES COMPANY, St. Paul, MN (US)

(72) Inventors: Matthew S. Stay, Minneapolis, MN (US); Shawn C. Dodds, St. Paul, MN (US); Ann M. Gilman, Woodbury, MN (US); Mikhail L. Pekurovsky, Bloomington, MN (US); Daniel J. Theis, Mahtomedi, MN (US); Matthew R. D. Smith, Woodbury, MN (US)

(73) Assignee: 3M INNOVATIVE PROPERTIES, COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/580,078

(22) PCT Filed: Jun. 22, 2016

(86) PCT No.: PCT/US2016/038757
§ 371 (c)(1),
(2) Date: Dec. 6, 2017

(87) PCT Pub. No.: WO2017/003789
PCT Pub. Date: Jan. 5, 2017

(65) Prior Publication Data
US 2018/0139855 A1    May 17, 2018

Related U.S. Application Data

(60) Provisional application No. 62/187,195, filed on Jun. 30, 2015.

(51) Int. Cl.
*H05K 3/46* (2006.01)
*G06F 3/041* (2006.01)
(Continued)

(52) U.S. Cl.
CPC ........... *H05K 3/4679* (2013.01); *G06F 3/041* (2013.01); *H05K 1/028* (2013.01); *H05K 1/0274* (2013.01);
(Continued)

(58) Field of Classification Search
USPC .......................................................... 427/58
See application file for complete search history.

(56) References Cited

U.S. PATENT DOCUMENTS 5,650,199 A * 7/1997 Chang .................... C04B 41/009
216/17
6,207,234 B1 * 3/2001 Jiang ..................... H01F 41/043
216/17
(Continued)

FOREIGN PATENT DOCUMENTS

WO  WO 2007-022226  2/2007
WO  WO 2009-077684  6/2009
WO  WO 2014-088950  6/2014

OTHER PUBLICATIONS

PEDOT:PSS, Wikipedia, 4 pgs, retrieved Jan. 11, 2019, https://en.wikipedia.org/wiki/PEDOT%3APSS.
(Continued)

*Primary Examiner* — Brian K Talbot
(74) *Attorney, Agent, or Firm* — James A. Baker

(57) ABSTRACT

A composite article includes a conductive layer with nanowires on at least a portion of a flexible substrate, wherein the conductive layer has a conductive surface. A patterned layer of a low surface energy material is on a first region of the conductive surface. An overcoat layer free of conductive
(Continued)

particulates is on a first portion of a second region of the conductive surface unoccupied by the patterned layer. A via is in a second portion of the second region of the conductive surface between an edge of the patterned layer of the low surface energy material and the overcoat layer. A conductive material is in the via to provide an electrical connection to the conductive surface.

2 Claims, 7 Drawing Sheets

(51) Int. Cl.
      H05K 1/09      (2006.01)
      H05K 3/40      (2006.01)
      H05K 1/02      (2006.01)
      H05K 1/11      (2006.01)
      H05K 3/10      (2006.01)
      H05K 3/00      (2006.01)
      H05K 1/03      (2006.01)

(52) U.S. Cl.
    CPC ............ *H05K 1/097* (2013.01); *H05K 1/115* (2013.01); *H05K 3/10* (2013.01); *H05K 3/4038* (2013.01); *H05K 3/4069* (2013.01); *H05K 3/4644* (2013.01); *G06F 2203/04102* (2013.01); *G06F 2203/04103* (2013.01); *H05K 1/0283* (2013.01); *H05K 1/0393* (2013.01); *H05K 3/0091* (2013.01); *H05K 3/0097* (2013.01); *H05K 3/4664* (2013.01); *H05K 2201/026* (2013.01); *H05K 2203/1173* (2013.01); *H05K 2203/1545* (2013.01); *H05K 2203/166* (2013.01)

(56) References Cited

U.S. PATENT DOCUMENTS

| | | | | |
|---|---|---|---|---|
| 6,975,067 | B2 | 12/2005 | McCormick | |
| 7,285,305 | B2 * | 10/2007 | Furusawa | H05K 3/4647 |
| | | | | 427/117 |
| 8,049,333 | B2 * | 11/2011 | Alden | B82Y 30/00 |
| | | | | 257/741 |
| 8,174,667 | B2 | 5/2012 | Allemand et al. | |
| 8,288,267 | B2 * | 10/2012 | Verilhac | H05K 3/0017 |
| | | | | 257/E23.021 |
| 8,994,081 | B2 | 3/2015 | Leobandung | |
| 10,492,305 | B2 * | 11/2019 | Stay | G06F 3/041 |
| 2004/0185258 | A1 * | 9/2004 | Fukushi | B32B 27/36 |
| | | | | 428/412 |
| 2008/0070349 | A1 * | 3/2008 | Matayabas | H01L 21/486 |
| | | | | 438/121 |
| 2008/0311285 | A1 * | 12/2008 | Hirai | H05K 3/4069 |
| | | | | 427/97.2 |
| 2009/0077798 | A1 * | 3/2009 | Hirai | H05K 3/4664 |
| | | | | 29/843 |
| 2010/0209611 | A1 * | 8/2010 | Ohshima | B41J 2/1606 |
| | | | | 427/256 |
| 2010/0221909 | A1 * | 9/2010 | Verilhac | H05K 3/0017 |
| | | | | 438/613 |
| 2011/0159207 | A1 | 6/2011 | Kamakura | |
| 2014/0305685 | A1 * | 10/2014 | Futamata | H05K 1/167 |
| | | | | 174/257 |
| 2015/0179621 | A1 * | 6/2015 | Matsumoto | H01L 25/16 |
| | | | | 257/737 |
| 2015/0279862 | A1 * | 10/2015 | Chuang | H01L 27/1218 |
| | | | | 257/40 |

OTHER PUBLICATIONS

Kumar, "Patterned Condensation Figures as Optical Diffraction Gratings", Science, Jan. 1994, vol. 263, pp. 60-62.
Meyer, "Controlled dewetting processes on microstructured surfaces—a new procedure for thin film microstructuring", Macromolecular Materials and Engineering, 2000, vol. 276-277, No. 1, pp. 44-50.
Sun, "Polyol Synthesis of Uniform Silver Nanowires: A Plausible Growth Mechanism and the Supporting Evidence", Nano Letters, 2003, vol. 3, No. 7, pp. 955-960.
Sun, "Uniform Silver Nanowires Synthesis by Reducing $AgNO_3$ with Ethylene Glycol in the Presence of Seeds and Poly(Vinyl Pyrrolidone)", Chemistry of Materials, 2002, vol. 14, No. 11, pp. 4736-4745.
"Waterless Printing", Wikipedia, [On Line], [Retrieved on Jan. 30, 2018] URL<http://en.wikipedia.org/wiki/Waterless_printing>, pp. 5.
Wyart, "Dynamics of partial wetting", Advances in Colloid and Interface Science, 1992, vol. 39, pp. 1-11.
International Search Report for PCT International Application No. PCT/US2016/038757, dated Nov. 2, 2016, 4 pages.

* cited by examiner

ELECTRONIC DEVICES COMPRISING A VIA AND METHODS OF FORMING SUCH ELECTRONIC DEVICES

CROSS REFERENCE TO RELATED APPLICATIONS

This application is a national stage filing under 35 U.S.C. 371 of PCT/US2016/038757, filed Jun. 22, 2016, which claims the benefit of U.S. Application No. 62/187,195, filed Jun. 30, 2015, the disclosure of which is incorporated by reference in its/their entirety herein.

BACKGROUND

Transparent conductors are utilized on touch screens to enable human touch or gesture interactions with computers, smart phones, and other graphics-based screen interfaces. Touch screen devices can be made by patterning (e.g., printing) a conductive material into electrical traces on a flexible substrate. Patterning of the conductive material can be performed in a roll-to-roll process where the substrate is unwound, converting operations such as printing and drying/curing are performed, and then the patterned substrate is wound again into a roll for further transport and processing. The patterned conductive layers can be connected to electronic circuit components such as, for example, flexible circuits, to form an electronic touch sensor that can be used as a component of an electronic device.

There are several approaches to patterning the conductive materials for use in electronic assemblies such as, for example, touch sensors.

In one example, the conductive material can be printed directly to form a pattern from a dispersion or ink, using standard printing processes such as, for example, ink-jet, gravure, flexographic, or screen printing. This direct printing technique produces a pattern in one step, with minimal waste. However, variations in the print thickness due to defects such as ribbing and pinholes may produce unacceptable variations in conductivity, as well as negatively impacting the optics of the sensor.

In another example, the surface of the substrate can be uniformly coated with the conductive material by forming a substantially continuous conductive layer. A resist material is then printed on the conductive layer using printing processes such as, for example, flexographic printing, gravure printing, ink jet printing, screen printing, spray coating, needle coating, photolithographic patterning, and offset printing. The patterned resist material allows selective removal of portions of the conductive layer to create a desired pattern (subtractive patterning). Selective removal is often accomplished either by wet chemical etching or laser ablation.

In some manufacturing processes, patterns of material may be deposited on the flexible substrate in layers through multiple deposition steps. Some articles require that the patterns be precisely registered on one or both sides of the substrate. To achieve accurate registration between the layers, lateral (cross web) positioning and longitudinal (down web) positioning must be maintained as the substrate moves through multiple manufacturing steps. Maintaining registration between layers formed on the substrate becomes more complex when the substrate is flexible or stretchable, and the patterns are made smaller and more intricately detailed. Various methods have been employed to improve the accuracy of these registration steps such as, for example, edge detection and the printing of fiducial marks.

In some fabrication processes, layers of conductive material are patterned, with each patterned layer separated by an insulating material. To make electrical connections to and between the conductive patterned layers in such a multi-layer construction without forming short-circuits, it can be important to create and maintain a reliable conductive path, generally referred to as a via, between the non-adjacent patterned conductive patterned layers. However, precise registration between adjacent layers to form vias in a multi-layer construction can be difficult, time-consuming and expensive.

SUMMARY

To reliably manufacture electronic touch screen devices in a roll-to-roll process using printing processes such as, for example ink-jet, gravure, flexographic, or screen printing, reliable techniques for forming vias between non-adjacent conductive nanowire (NW) layers can reduce defects and lower product costs.

In general, the present disclosure relates to a self-forming via that can be easily created and reliably maintained during the application and registration of multiple printed conductive nanowire layers separated by insulating layers. In general, the present disclosure relates to a method for patterning an overcoat layer on a transparent conductive surface, wherein the conductive surface is on a conductive layer including nanowires. The conductive layer is disposed on a flexible substrate. In the method a patterned layer of a low surface energy material is formed in a first region of the conductive surface, with a second region remaining uncoated by the patterned layer. When a layer of a liquid overcoat composition is coated over the first and the second regions, the difference in the wettability of the first region relative to that of the second region destabilizes the layer of the liquid overcoat composition and causes the liquid overcoat composition to dewet from the low surface energy material and withdraw from the patterned layer. A first amount of the liquid overcoat composition recedes from the edges of the patterned layer and a collects in a first portion of the second region of the conductive surface. A second residual amount, which is smaller than the first amount, remains in a second portion of the second region of the conductive surface adjacent to the edges of the patterned. When the liquid overcoat composition is cured to form an overcoat layer, a via created in the second portion of the second region of the conductive surface can be utilized as an access point to form an electrical connection to the conductive surface. Using the via, an electrical connection can be formed with the conductive surface by various techniques such as, for example, applying a conductive paste in the via, or by directly bonding an electronic connection to the conductive surface in the via.

In some embodiments, the overcoat layer can act as a further substrate onto which another low surface energy pattern can be created and a further overcoat solution coated, or the overcoat layer can be removed as necessary. Third and subsequent patterned layers can be formed by repeating a similar surface wettability modification technique, but the via formed on the conductive surface by the initial low surface energy pattern remains in registration as the additional layers are added, and continues to provide a path for electrical connection to the conductive surface.

In one aspect, the present disclosure is directed to a composite article, including a conductive layer on at least a portion of a flexible substrate, wherein the conductive layer includes nanowires, and wherein the conductive layer has a conductive surface. A patterned layer of a low surface energy material is on a first region of the conductive surface. An overcoat layer free of conductive particulates is on a first portion of a second region of the conductive surface unoccupied by the patterned layer. A via is in a second portion of the second region of the conductive surface between an edge of the patterned layer of the low surface energy material and the overcoat layer; and a conductive material in the via provides an electrical connection to the conductive surface.

In another aspect, the present disclosure is directed to a composite article including a conductive layer on at least a portion of a flexible substrate, wherein the conductive layer includes nanowires, and wherein the conductive layer has a conductive surface. A patterned conductive layer is on a first region of the conductive surface, wherein a second region of the conductive surface is uncovered by the patterned conductive layer; and a patterned low surface energy layer on a first portion of the patterned conductive layer, wherein a second portion of the patterned conductive layer is uncovered by the patterned low surface energy layer. An overcoat layer free of conductive particulates is on the second region of the conductive surface, and a via is between the overcoat layer and first portion of the patterned conductive layer, wherein the via overlies the second portion of the patterned conductive layer. A conductive material in the via provides an electrical connection to the patterned conductive layer and the conductive surface.

In yet another aspect, the present disclosure is directed to a method of forming a composite article, including: coating a patterned layer of a low surface energy material onto a first region of a conductive surface disposed on a flexible substrate, wherein the conductive surface includes nanowires, and wherein a second region of the conductive surface remains uncovered by the patterned layer; coating a layer of a liquid overcoat composition over the patterned layer of the low energy material and the second regions of the conductive surface, wherein the liquid overcoat composition has a surface energy different from the surface energy of the low surface energy material; de-wetting the liquid overcoat composition from the patterned layer of the low surface energy material such that the liquid overcoat composition withdraws from the patterned layer of the low surface energy material and a first amount of the liquid overcoat composition collects in a first portion of the second region of the conductive surface, wherein the liquid overcoat composition recedes from an edge of the patterned layer of the low surface energy material such that a second residual amount of the liquid overcoat composition less than the first amount remains in a second portion of the second region of the conductive surface adjacent to the edge of the patterned layer of the low surface energy material; curing the liquid overcoat composition to form a discontinuous overcoat layer in the first portion of the second region of the conductive surface and a via in the second portion of the second region of the conductive surface, wherein the via is adjacent to the edge of the patterned layer of the low surface energy material; and electrically contacting the conductive surface through the via.

In yet another aspect, the present disclosure is directed to a method of forming a composite article, including: coating a first patterned layer of a conductive material on a first region of a conductive surface on a conductive layer disposed on a flexible substrate, wherein the conductive surface includes nanowires, and wherein a second region of the conductive surface is uncoated by the first patterned layer of the conductive material; coating a second patterned layer of a low surface energy material on a first portion of the first patterned layer of the conductive material, wherein a second portion of the first patterned layer is uncoated by the second patterned layer; coating a layer of a liquid overcoat composition onto the first and the second regions of the conductive surface, wherein the liquid overcoat composition has a surface energy greater than the surface energy of the low surface energy material in the second patterned layer; de-wetting the liquid overcoat composition from the second patterned layer of the low surface energy material such that a first amount of the liquid overcoat composition withdraws from the second patterned layer and collects in the second region of the conductive surface, and wherein a second amount of the liquid overcoat composition less than the first amount remains in the second portion of the first patterned layer of the conductive material; curing the liquid overcoat composition to form a discontinuous overcoat layer in the second region of the conductive surface, wherein the overcoat layer is separated from the second patterned layer by a via overlying the second portion of the first patterned layer; and electrically contacting the second portion of the first patterned layer through the via.

The methods described in this disclosure can enable roll-to-roll continuous patterned coating, which has significant cost and productivity benefits over batch processes. As only desired areas on the conductive surface are coated with the overcoat solution, the presently described method can more cost-effectively use coating materials. In various embodiments, the techniques of the present disclosure can be used for low-cost manufacture of, for example, flexible displays, electronics, OLED's, PLEDs, touch-screens, fuel-cells, solid state lighting, photovoltaic and other complex opto-electronic devices.

In various embodiments, the present method provides a number of advantages over techniques in which the liquid overcoat composition is printed directly on the conductive surface, particularly in high-speed continuous roll-to-roll processes. For example, rotary printing processes (such as flexography, gravure, and rotary screen printing) transfer a liquid from one roll to the next, which is known as a film split. This film split can result in a ribbing defect, which produces non-uniformities in the coating. By applying the liquid overcoat composition as a continuous layer, instead of as a pattern, coating methods can be used that do not require a film split, such as die coating, notch bar coating, or reverse gravure coating. The technique of the present disclosure can also allow more precise control of the thickness of the liquid overcoat composition. More precise control of coating thickness can reduce non-uniformities produced by the ribbing defect and reduce the formation of pinholes in the overcoat layer, which provide unwanted access points to areas of the underlying conductive layer. Removing the necessity of printing the liquid overcoat layer can also increase the number of different materials available for use as over-coats, since the restrictions on the rheology of a printed material can be much greater than on a coated material.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 1C-1 is a magnified cross-sectional view of an embodiment of a process for making an overcoat layer on a conductive surface and making an electrical connection to the conductive surface.

Like symbols in the drawings indicate like elements.

DETAILED DESCRIPTION

The present disclosure describes processes for coating discrete areas of a flexible substrate in a continuous roll-to-roll manner. In general, the methods include creating a pattern of a low surface energy material in a first region of a conductive surface including nanowires, which leaves relatively higher surface energy second regions of the conductive surface uncoated. When an overcoat solution is coated on the first and the second regions, the overcoat solution dewets and withdraws from the first region of the conductive surface, and recedes from the edges of the low surface energy pattern. A first amount of the overcoat solution collects in a first portion of the second region. A second residual amount of the overcoat solution, which is less than the first amount, remains in a second portion of the second region adjacent to the edges of the low surface energy pattern, and can provide a path to access the conductive surface.

Figure 1A:
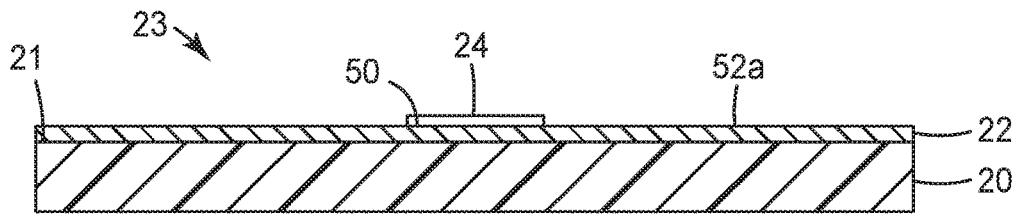
FIGS. 1A-1E are schematic cross-sectional views of an embodiment of a process for making an overcoat layer on a conductive surface and making an electrical connection to the conductive surface.

Referring to an embodiment of the process illustrated schematically in FIG. 1A, a conductive layer 22 is disposed on a flexible substrate 20.

The flexible substrate 20 can be clear or opaque, conductive or non-conductive (insulative), and suitable flexible substrates can be selected from any material that can be rolled up and processed in a roll-to-roll manufacturing process. Examples of suitable flexible substrates 20 include, but are not limited to: polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Optionally, a major surface 21 of the substrate 20 underlying the conductive layer 22 can be pre-treated to prepare the surface to better receive the subsequent deposition of the conductive layer. In some embodiments, the pre-treatment step can be carried out in conjunction with a patterning step to create patterned deposition of the conductive layer 22. For example, pre-treatments can include solvent or chemical washing, heating, deposition of an optional patterned intermediate layer, as well as further surface treatments such as plasma treatment, ultraviolet radiation (UV)-ozone treatment, or corona discharge.

The conductive layer 22 can be applied to the substrate 20 at a given thickness selected to achieve desired optical and electrical properties. This application can be performed using known coating methods, such as, for example, slot coating, roll coating, Mayer rod coating, dip coating, curtain coating, slide coating, knife coating, gravure coating, notch bar coating or spraying, yielding a conductive nanowire layer on the substrate. The conductive layer 22 can also be deposited non-continuously using a printing technique including, but not limited to, gravure, flexographic, screen, letterpress, ink jet printing, and the like.

Suitable materials for the conductive layer 22 include nanowires. For example, PCT publication WO 2007/022226, entitled "Nanowire-Based Transparent Conductors" discloses a nanowire material sold by Cambrios Technologies Corp., Sunnyvale, Calif., which can be patterned into a suitable grid to enable the production of touch screens for use with computers.

In this application, the term nanowire refers to conductive metal or non-metallic filaments, fibers, rods, strings, strands, whiskers, or ribbons having high aspect ratios (e.g., higher than 10). Examples of non-metallic conductive nanowires include, but are not limited to, carbon nanotubes (CNTs), metal oxide nanowires (e.g., vanadium pentoxide), metalloid nanowires (e.g., silicon), conductive polymer fibers and the like.

As used herein, "metal nanowire" refers to a metallic wire including elemental metal, metal alloys or metal compounds (including metal oxides). At least one cross sectional dimension of the metal nanowire is less than 500 nm, or less than 200 nm, and more preferably less than 100 nm. As noted, the metal nanowire has an aspect ratio (length:width) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and polyvinyl pyrrolidone). Large-scale production of silver nanowires of uniform size can be prepared according to the methods described in, e.g., Xia, Y. et al., *Chem. Mater.* (2002), 14, 4736-4745, and Xia, Y. et al., *Nanoletters* (2003) 3(7), 955-960. More methods of making nanowires, such as using biological templates, are disclosed in WO 2007/022226.

In certain embodiments, the nanowires are dispersed in a liquid and a nanowire layer on the substrate is formed by coating the liquid containing the nanowires onto the substrate and then allowing the liquid to evaporate (dry) or cure. The nanowires are typically dispersed in a liquid to facilitate more uniform deposition onto the substrate by using a coater or sprayer.

Any non-corrosive liquid in which the nanowires can form a stable dispersion (also called "nanowire dispersion") can be used. Preferably, the nanowires are dispersed in water, an alcohol, a ketone, ethers, hydrocarbons or an aromatic solvent (benzene, toluene, xylene, etc.). More preferably, the liquid is volatile, having a boiling point of no more than 200 degrees C. (° C.), no more than 150° C., or no more than 100° C.

In addition, the nanowire dispersion may contain additives or binders to control viscosity, corrosion, adhesion, and nanowire dispersion. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DuPont).

In one example, a nanowire dispersion, or "ink" used to form the conductive layer 22 includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl FSN, Zonyl FSO, Zonyl FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

If it is desired to change the concentration of the dispersion from that disclosed above, the percent of the solvent can be increased or decreased. In preferred embodiments the relative ratios of the other ingredients, however, can remain the same. In particular, the ratio of the surfactant to the viscosity modifier is preferably in the range of about 80:1 to about 0.01:1; the ratio of the viscosity modifier to the nanowires is preferably in the range of about 5:1 to about 0.000625:1; and the ratio of the nanowires to the surfactant is preferably in the range of about 560:1 to about 5:1. The ratios of components of the dispersion may be modified depending on the substrate and the method of application used. The preferred viscosity range for the nanowire dispersion is between about 1 and 1000 cP (0.001 and 1 Pa-s).

The conductive layer 22 is substantially continuous over at least a portion of the first major surface 21 of the flexible substrate 20, and desirably over at least 50%, 60%, 70%, 80%, or 90% of the area of the first major surface 21. The conductive layer 22 may be coated continuously along the surface 21 of the flexible substrate 20, or may be applied in discrete blocks or rectangles, leaving uncoated substrate areas between them, with the blocks or rectangles having a size similar to the overall size of the intended touch sensor being produced.

Referring again to FIG. 1A, a pattern 24 of a low surface energy material is coated on and overlies a first region 50 of a conductive surface 23 the conductive layer 22, which leaves a second relatively higher surface energy region 52 of the conductive surface 23 uncoated. In this application the term low surface energy material refers to any material (for sufficient density to render the surface 21 of the substrate 22 conductive, it being recognized that the surface 21 may include individual conductive areas with relatively non-conductive openings or spaces between them, for example, an ink) that can induce dewetting of a subsequently applied overcoat composition in a desired area of the surface 23 of the conductive layer 22. Suitable low surface energy materials for the pattern 24 can vary widely, and can include, but are not limited to plastics, rubbers and composite materials with a surface energy of less than about 100 mJ/m$^2$, less than about 50 mJ/m$^2$, less than about 30 mJ/m$^2$, less than about 20 mJ/m$^2$, or less than about 10 mJ/m$^2$. Non-limiting examples of low surface energy materials include fluoropolymers such as polyhexafluoropropylene, polytetrafluoroethylene (PTFE) and the like, was well as polymeric resins such as poly(vinylidene fluoride) (PVF), polyethylene (PE), polypropylene (PP), poly(methylmethacrylate) (PMMA), polystyrene (PS), polyamides, poly(vinylchloride) (PVC), poly(vinylidene chloride), poly(ethylene terephthalate) (PET), epoxies, phenol resins, styrene-butadiene rubber, acrylonitrile rubbers, and the like, thermally curable or ultraviolet (UV) curable silicones, and mixtures and combinations thereof. In some embodiments, the low surface energy material included silicones such as those available from Dow Chemical, Midland, Mich., under the trade designation Syl-Off.

The coating composition used to form the pattern of the low surface energy material 24 typically includes at least one of the low surface energy materials listed above and optional additives such as a fluorinated or non-fluorinated surfactant, a crosslinker, an aqueous or organic solvent, and the like. In some example embodiments, the coating solution used to form the pattern 24 includes a low surface energy material such as a thermally or UV curable silicone "ink" and a crosslinker, or an acrylic resin and a fluorinated surfactant. In some embodiments, the coating composition used to form the pattern 24 may be combined with a conductive material such as, for example, metal particles or a silver paste ink, to make the pattern 24 of the low surface energy material itself be conductive and provide additional points of access to the conductive surface 23 of the conductive layer 22.

The coating composition used to form the pattern 24 may be coated on the conductive surface 23 by a wide variety of printing techniques such as, for example, flexographic printing, gravure coating, offset printing, screen printing, plasma deposition, photolithography, micro-contact printing, inkjet printing or selective removal of a uniform layer of the material by laser or other etching technique, optically writing with light or a laser, electrostatic spray or by plasma treatment.

In various embodiments, the patterned layer 24 of the low energy material has a dry thickness of about 100 nm to about 10 μm. If the patterned layer 24 of the low energy material has a dry thickness of about 100 nm to about 300 nm, the patterned layer 24 may be sufficiently thin to allow some of the nanowires to protrude above the surface of the patterned layer 24, which can provide a route for electrical connection to the conductive surface 23 and the conductive layer 22 through the patterned layer 24.

Figure 1B:
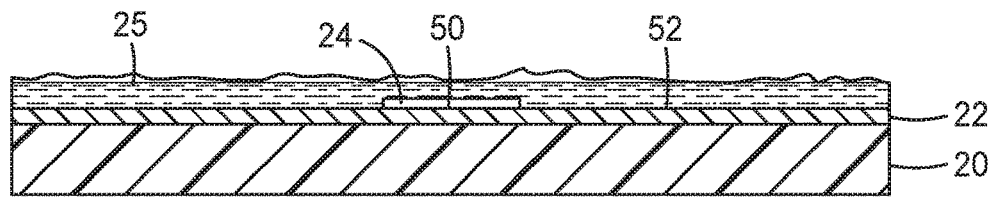

Referring to FIG. 1B, a liquid overcoat composition 25 is then coated over the conductive surface 23 of the conductive layer 22, and initially covers both the printed pattern of the low surface energy material 24 overlying the first region 50 of the surface 23, as well as the second region of the surface 23 that is uncoated with the pattern 24. In various embodiments, the liquid overcoat composition is coated to a thickness of about 10 μm to about 15 μm. The liquid overcoat composition 25 may be applied to the conductive surface 23 using any suitable printing technique including, for example, flood coating, gravure coating, curtain coating, bead coating, offset printing, screen printing, inkjet printing, spraying, or by means of a blade, roller, or air knife.

The liquid overcoat composition 25 can include any material having a surface energy sufficiently greater than that of the low surface energy material in the pattern 24 to cause the liquid overcoat composition to dewet from the pattern 24 in a commercially useful amount of time. The speed at which the liquid overcoat composition 25 rearranges about the patterned layer 24 can impact the speed at which the predetermined areas of the conductive surface 23 can be coated in a roll-to-roll process. A discussion of the rates of recession of liquids from low surface energy materials can be found in, for example, Brouchard-Wyart and de Gennes, *Advan. Colloid Interface Sci.*, 39 (1992), which is incorporated herein by reference.

If the liquid coating composition 25 is coated as a uniform layer, it is necessary to destabilize the layer so the liquid overcoat composition separates, flows off, and withdraws from the patterned layer 24 of the low surface energy material. While not wishing to be bound by any theory, presently available evidence indicates that if the liquid overcoat composition is sufficiently dilute, or when it becomes sufficiently thin during subsequent drying steps, spontaneous dewetting from the pattern 24 to the regions 52 of the conductive surface 23 areas takes place, without the need for any active destabilization. In some embodiments, the liquid overcoat composition 25 can include conductive particulates that can be used to form randomly arranged conductive pathways through the overcoat layer ultimately formed by curing from the liquid overcoat composition. In other embodiments, conductive or non-conductive particulates in the liquid overcoat composition 25 can be used to initiate or maintain destabilization of the liquid overcoat composition 25 so the liquid overcoat composition 25 can more easily separate, flow off and withdraw from the patterned layer 24 of the low surface energy material. In some embodiments, the liquid overcoat composition 25 is substantially free of particulate material, which in this application means that the liquid overcoat composition includes less than about 5% by weight of conductive or non-conductive particulates, or less than about 1% by weight of conductive or non-conductive particulates, or less than about 0.5% by weight of conductive or non-conductive particulates. In some embodiments, the liquid overcoat composition 25 is free of conductive or non-conductive particulates, which means that the liquid overcoat composition includes no particulate material.

Suitable liquid overcoat compositions include a polymer, and desirably an optically clear polymer. Examples of suitable polymeric materials include, but are not limited to: polyacrylics such as polymethacrylates, polyacrylates and polyacrylonitriles, polyvinyl alcohols, polyesters (e.g., polyethylene terephthalate (PET), polyester naphthalate (PEN), and polycarbonates (PC)), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbomenes, synthetic rubbers (e.g. EPR, SBR, EPDM), and fluoropolymers (e.g., polyvinylidene fluoride (PVDF), polytetrafluoroethylene (PTFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by DuPont Corp.).

In other embodiments, the liquid overcoat composition 25 includes a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In some embodiments, the prepolymer is photo-curable, i.e., the prepolymer polymerizes and/or cross-links upon exposure to irradiation such as, for example ultraviolet (UV) radiation.

The liquid overcoat composition 25 may optionally include a solvent (e.g., during application). Any non-corrosive solvent that can effectively solvate or disperse the polymeric overcoat material can be used, and examples include water, an alcohol, a ketone, an ether, tetrahydrofuran, hydrocarbons (e.g. cyclohexane) or an aromatic solvent (benzene, toluene, xylene, etc.). The solvent can be volatile, having a boiling point of no more than 200° C., no more than 150° C., or no more than 100° C.

In some embodiments, the liquid overcoat composition 25 may include a cross-linker, a polymerization initiator, stabilizers (including, for example, antioxidants, and UV stabilizers for longer product lifetime and polymerization inhibitors for greater shelf-life), surfactants and the like. In some embodiments, the liquid overcoat composition 25 may further include a corrosion inhibitor. In some embodiments, the liquid overcoat composition 25 is conductive, and can include a conductive polymer such as, for example, polyanilines, polythiophenes, and polydiacetylenes.

In some embodiments, the liquid overcoat composition 25 can be cured or dried to form an optically clear material. A material is considered optically clear if the light transmission of the material is at least 80% in the visible region (400 nm-700 nm). Unless specified otherwise, all the layers (including the substrate) described herein are preferably optically clear. The optical clarity of the liquid overcoat composition 25 is typically determined by a multitude of factors, including without limitation: the refractive index (RI), thickness, smoothness, consistency of the RI throughout the thickness, surface (including interface) reflection, and scattering caused by surface roughness and/or embedded particles.

In some embodiments, the liquid overcoat composition 25 includes an ink such as those available under the trade designation FLEXOCURE FORCE from Flint Group, Plymouth, Minn., as well as transparent varnishes from Nazdar (OP series), SolarFlex or SunBar series from Sun Chemical, and acrylate resins from Sartomer.

Figure 1C:
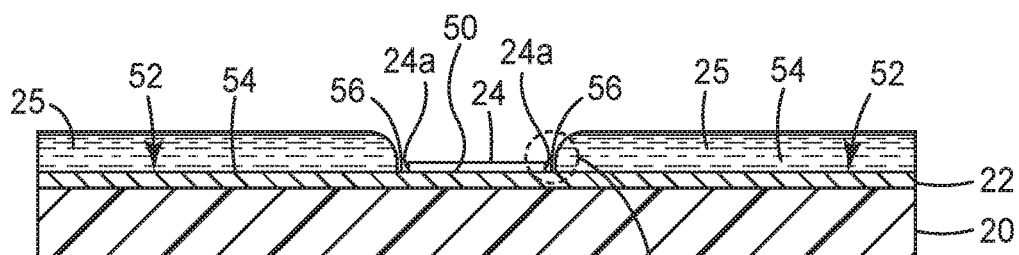

Referring now to FIG. 1C, the difference between the wettability of the patterned low surface energy layer 24 and the wettability of the conductive surface 23 causes instability in the liquid overcoat composition 25. This instability causes the liquid overcoat composition 25 to separate, then run off and withdraw from the patterned layer of low surface energy material 24. The liquid overcoat composition 25 then flows away from the patterned layer of low surface energy material 24 and a first amount of the liquid overcoat composition 25 is directed to collect in a discrete areas of the second region 52 of the conductive surface 23, which are referred to herein as the first portion 54 of the second region 52. The presence of the low surface energy material in the patterned layer 24 also causes the liquid overcoat composition 25 to pull away and substantially uniformly recede from the edges 24A of the patterned layer 24, leaving a second residual amount of the liquid overcoat composition 25 in a second portion 56 of the second region 52 of the conductive surface 23 adjacent the edges 24A. The second residual amount of the liquid overcoat composition 25 overlying the second portion 56 of the second region 52 of the conductive surface 23 is less than the first amount of the overcoat composition overlying the first portion 54 of the second region 52 of the conductive surface 23. In the embodiment shown in FIG. 1C, none of the liquid overcoat composition remains in the second portion 56 of the second region 52 of the conductive surface 23. In the embodiment of FIG. 1C the second portion 56 is free of and uncovered by the liquid overcoat composition 25, which leaves the conductive surface 23 completely exposed.

Figures 1, 1C:
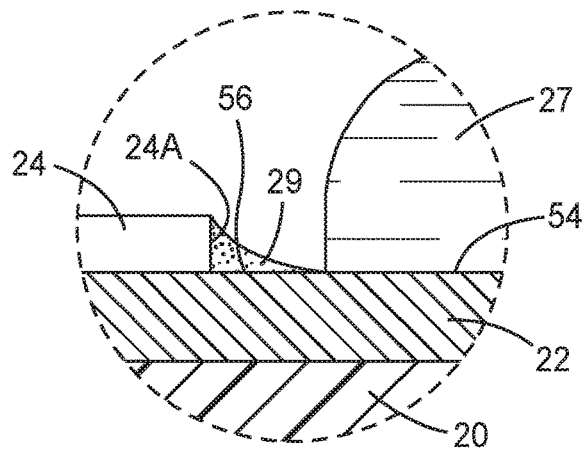

In another embodiment shown in FIG. 1C-1, a first amount of the liquid overcoat composition 27 does not completely recede from the second portion 56 of the second region 52 of the conductive surface 23. A second residual amount 29 of the liquid overcoat composition 25 clings to the edges 24A of the patterned layer 24 and overlies the second portion 56 of the conductive surface 23. The thickness of the second residual amount 29 on the conductive surface 23 in the second portion 56 can vary widely depending on the relative wettability of the patterned layer 24 and the liquid overcoat composition 25, but in various embodiments the thickness of the second residual amount 29 of the liquid overcoat composition 25 is no greater than about 250 nm.

Figure 1D:
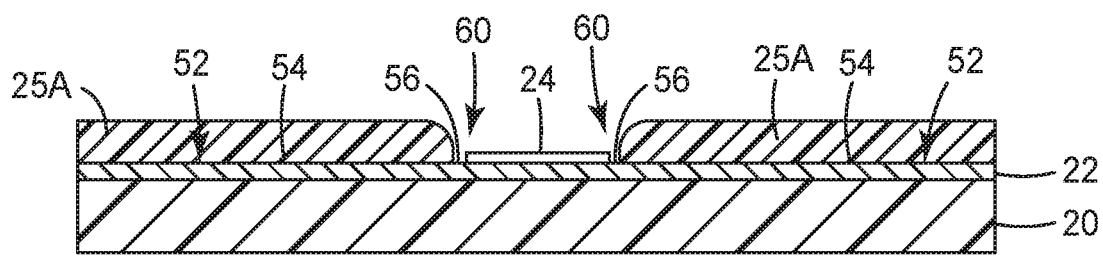

Referring now to FIG. 1D, the liquid overcoat composition is cured and/or hardened into a protective layer 25A in the first portion 54 of the second region 52 of the conductive surface 23 of the conductive layer 22. "Cure or curing" refers to a process where monomers or partial polymers (e.g. oligomers comprising fewer than 150 monomer units) polymerize so as to form a solid polymeric matrix, or where polymers cross-link. Suitable polymerization or cross-linking conditions are well known in the art and include by way of example, heating the monomer, irradiating the monomer with visible or ultraviolet (UV) light, electron beams, and the like. Alternatively, "harden(s) or hardening" may be caused by solvent removal during drying of a resist matrix material, for example without polymerization or cross-linking.

Following curing, in the embodiment of FIG. 1D the second portion 56 of the second region 52 of the conductive surface 23 remains uncovered by the protective layer 25A. This zone adjacent to the edges of the patterned layer 24 having no residual amount of the protective layer 25A in the second portion 56 effectively forms an arrangement of vias or access channels 60 that extend from above the protective layer 25A to the conductive surface 23 of the conductive nanowire layer 22. In another embodiment not shown in FIG. 1D, a very thin residual amount of the protective layer 25A with a thickness no greater than about 250 nm, or no greater than about 100 nm, or no greater than about 75 nm, or no greater than about 50 nm, or no greater than about 10 nm, or no greater than about 5 nm, remains in the second portion 56 of the second region 52 of the conductive surface 23. This extremely thin portion of the protective layer 25A overlying the second portion 56 of the conductive surface 23 forms an arrangement of vias or access channels 60 that extend from above the protective layer 25A to the conductive surface 23 of the conductive nanowire layer 22.

Figure 1E:
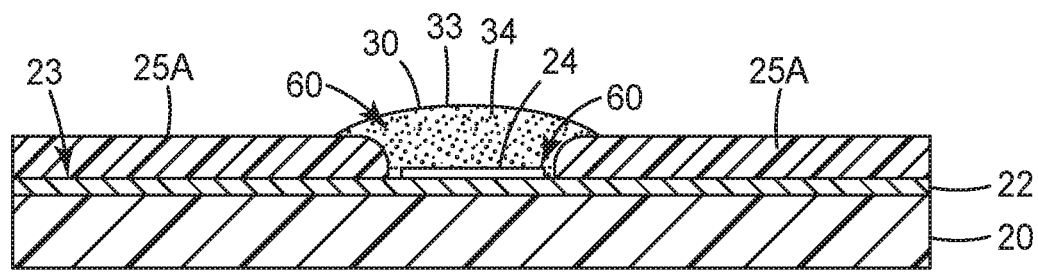

Referring to FIG. 1E, a layer of an electrically conductive material 30 can be applied over the patterned low surface energy layer 24. The conductive material 30 extends into the vias 60 and to the selected areas of the conductive surface 23 of the conductive layer 22. In the embodiment of FIG. 1E, there electrically conductive material 30 directly contacts the conductive surface 23 of the conductive nanowire layer 22. However, if a very thin residual amount of the protective layer 25A with a thickness no greater than about 250 nm, or no greater than about 100 nm, or no greater than about 75 nm, or no greater than about 50 nm, or no greater than about 10 nm, or no greater than about 5 nm, remains in the second portion 56 of the second region 52 of the conductive surface 23, the conductive material 30 can rest on top of the protective layer 25A and still form an electrical connection through the protective layer 25A to the conductive surface 23 of the conductive nanowire layer 22.

In some embodiments, the conductive material 30 is a paste or adhesive matrix 32 having therein metal particles or scrim 34 of silver, gold, copper, aluminum and the like, and mixtures thereof. In other embodiments, the particles 34 are nonconductive particles (for example, polymers) having a conductive coating. In various embodiments, the matrix 32 is selected from an acrylate adhesive, an epoxy adhesive, a silicone adhesive, or a mixture or combination thereof. In one example, the conductive material 30 is a silver ink such as those available from PChem Associates, Bensalem, Pa., under the trade designation PFI-722.

The metal particles 34 provide conductivity through the thickness of the matrix 32. This conductivity enables electrical connection between the conductive layer 22 and a contact pad of an electronic component (not shown in FIG. 1E) without inducing undesirable "shorts" between the contact pads in either the conductive layer 22 or the electronic component.

In another embodiment not shown in FIG. 1E, an electrical connection could be made to the conductive layer 22 through the vias 60 by directly bonding the metal contacts of an electrical component to the conductive layer 22. This direct bonding mitigates the need for any other intermediate conductive paste or printed conductor between the metal contacts of the electronic component and the conductive layer 22, which can simplify the construction of the electronic assembly. The electronic component may vary widely depending on the intended application, and in some embodiments includes a flexible circuit, a printed circuit board (PCB), a glass panel, or a pattern of wires.

In some embodiments, multiple layers can be overcoated simultaneously (not shown in FIG. 1E), and the original via structure is maintained, thus allowing perfect registration of all the layers with the patterned layer of the low energy material 24. The structure of the vias 60 allows electrical connection to the conductive layer 22 even if multiple layers are applied.

Figure 2A:
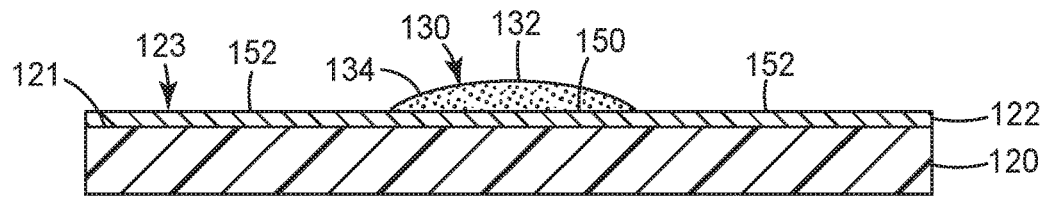
FIGS. 2A-2E are schematic cross-sectional views of another embodiment of a process for making an overcoat layer on a conductive surface and making an electrical connection to the conductive surface.

Referring to another embodiment of the process illustrated schematically in FIG. 2A, a conductive layer 122 is disposed on a flexible substrate 120.

The flexible substrate 120 can be clear or opaque, conductive or non-conductive (insulative), and suitable flexible substrates can be selected from any material that can be rolled up and processed in a roll-to-roll manufacturing process. Examples of suitable flexible substrates 120 include, but are not limited to: polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Optionally, a major surface 121 of the substrate 120 underlying the conductive layer 122 can be pre-treated to prepare the surface to better receive the subsequent deposition of the conductive layer. In some embodiments, the pre-treatment step can be carried out in conjunction with a patterning step to create patterned deposition of the conductive layer 122. For example, pre-treatments can include solvent or chemical washing, heating, deposition of an optional patterned intermediate layer, as well as further surface treatments such as plasma treatment, ultraviolet radiation (UV)-ozone treatment, or corona discharge.

The conductive layer 122 can be applied to the substrate 120 at a given thickness selected to achieve desired optical and electrical properties. This application can be performed using known coating methods, such as, for example, slot coating, roll coating, Mayer rod coating, dip coating, curtain coating, slide coating, knife coating, gravure coating, notch bar coating or spraying, yielding a conductive nanowire layer on the substrate. The conductive layer 122 can also be deposited non-continuously using a printing technique including, but not limited to, gravure, flexographic, screen, letterpress, ink-jet printing, and the like.

Suitable materials for the conductive layer 122 include nanowires such as those described in PCT publication WO 2007/022226 referenced above. In this application, the term nanowire refers to conductive metal or non-metallic filaments, fibers, rods, strings, strands, whiskers, or ribbons having high aspect ratios (e.g., higher than 10). Examples of non-metallic conductive nanowires include, but are not limited to, carbon nanotubes (CNTs), metal oxide nanowires (e.g., vanadium pentoxide), metalloid nanowires (e.g., silicon), conductive polymer fibers and the like.

As used herein, "metal nanowire" refers to a metallic wire including elemental metal, metal alloys or metal compounds (including metal oxides). At least one cross sectional dimension of the metal nanowire is less than 500 nm, or less than 200 nm, and more preferably less than 100 nm. As noted, the metal nanowire has an aspect ratio (length:width) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and polyvinyl pyrrolidone). Large-scale production of silver nanowires of uniform size can be prepared according to the methods described in, e.g., Xia, Y. et al., Chem. Mater. (2002), 14, 4736-4745, and Xia, Y. et al., Nanoletters (2003) 3(7), 955-960. More methods of making nanowires, such as using biological templates, are disclosed in WO 2007/022226.

In certain embodiments, the nanowires are dispersed in a liquid and a nanowire layer on the substrate is formed by coating the liquid containing the nanowires onto the substrate and then allowing the liquid to evaporate (dry) or cure. The nanowires are typically dispersed in a liquid to facilitate more uniform deposition onto the substrate by using a coater or sprayer.

Any non-corrosive liquid in which the nanowires can form a stable dispersion (also called "nanowire dispersion") can be used. Preferably, the nanowires are dispersed in water, an alcohol, a ketone, ethers, hydrocarbons or an aromatic solvent (benzene, toluene, xylene, etc.). More preferably, the liquid is volatile, having a boiling point of no more than 200 degrees C. (° C.), no more than 150° C., or no more than 100° C.

In addition, the nanowire dispersion may contain additives or binders to control viscosity, corrosion, adhesion, and nanowire dispersion. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl FSN, Zonyl FSO, Zonyl FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

If it is desired to change the concentration of the dispersion from that disclosed above, the percent of the solvent can be increased or decreased. In preferred embodiments the relative ratios of the other ingredients, however, can remain the same. In particular, the ratio of the surfactant to the viscosity modifier is preferably in the range of about 80:1 to about 0.01:1; the ratio of the viscosity modifier to the nanowires is preferably in the range of about 5:1 to about 0.000625:1; and the ratio of the nanowires to the surfactant is preferably in the range of about 560:1 to about 5:1. The ratios of components of the dispersion may be modified depending on the substrate and the method of application used. The preferred viscosity range for the nanowire dispersion is between about 1 and 1000 cP (0.001 and 1 Pa·s).

The conductive layer 122 is substantially continuous over at least a portion of the first major surface 121 of the flexible substrate 120, and desirably over at least 50%, 60%, 70%, 80%, or 90% of the area of the first major surface 121. The conductive layer 122 may be coated continuously along the surface 121 of the flexible substrate 120, or may be applied in discrete blocks or rectangles, leaving uncoated substrate areas between them, with the blocks or rectangles having a size similar to the overall size of the intended touch sensor being produced. By "substantially continuous" it is meant the conductive layer 122 is applied at a sufficient density to render the surface 121 of the substrate 122 conductive, it being recognized that the surface 121 may include individual conductive areas with relatively non-conductive openings or spaces between them.

Referring again to FIG. 2A, a patterned layer of an electrically conductive material 130 is applied over a first region 150 of a conductive surface 123 of the conductive layer 122, leaving a second region 152 of the conductive surface 123 uncovered. In some embodiments, the conductive material 130 is a paste or adhesive matrix 132 having therein metal particles or scrim 134 of silver, gold, copper, aluminum and the like, and mixtures thereof. In other embodiments, the particles 134 are nonconductive particles (for example, polymers) having a conductive coating. In various embodiments, the matrix 132 is selected from an acrylate adhesive, an epoxy adhesive, a silicone adhesive, or a mixture or combination thereof. In one example, the conductive material 130 is a silver ink such as those available from PChem Associates, Bensalem, Pa., under the trade designation PFI-722.

The metal particles 134 provide conductivity through the thickness of the matrix 132, which enables electrical connection to the conductive layer 122.

Figure 2B:
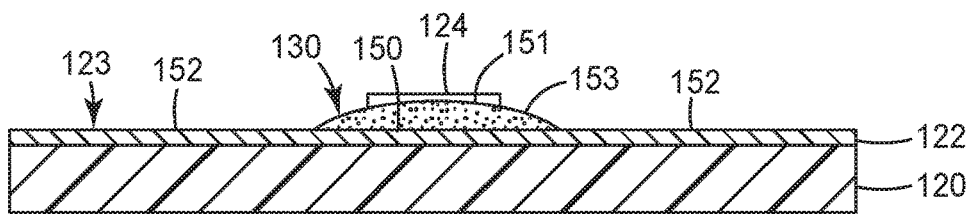

Referring now to FIG. 2B, a pattern 124 of a low surface energy material is coated on and overlies a first portion 151 of the patterned layer of electrically conductive material 130, which leaves a second portion 153 of the patterned layer of electrically conductive material 130 uncovered. In various embodiments, the pattern 124 of the low surface energy material is printed in registration with the pattern of the electrically conductive material 130 using alignment techniques such as, for example, edge detection or by tracking printed fiducial marks.

As above, the term low surface energy material refers to any material (for example, an ink) that can induce dewetting of a subsequently applied overcoat composition in a desired area of the surface 123 of the conductive layer 122.

Suitable low surface energy materials for the pattern 124 can vary widely, and can include, but are not limited to plastics, rubbers and composite materials with a surface energy of less than about 100 mJ/m$^2$, less than about 50 mJ/m$^2$, less than about 30 mJ/m$^2$, less than about 20 mJ/m$^2$ or less than about 10 mJ/m$^2$. Non-limiting examples of low surface energy materials include fluoropolymers such as polyhexafluoropropylene, polytetrafluoroethylene (PTFE) and the like, was well as polymeric resins such as poly (vinylidene fluoride) (PVF), polyethylene (PE), polypropylene (PP), poly(methylmethacrylate) (PMMA), polystyrene (PS), polyamides, poly(vinylchloride) (PVC), poly(vinylidene chloride), poly(ethylene terephthalate) (PET), epoxies, phenol resins, styrene-butadiene rubber, acrylonitrile rubbers, and the like, thermally curable or ultraviolet (UV) curable silicones, and mixtures and combinations thereof. In some embodiments, the low surface energy material included silicones such as those available from Dow Chemical, Midland, Mich., under the trade designation Syl-Off.

The coating composition used to form the pattern 124 typically includes at least one of the low surface energy materials listed above and optional additives such as a fluorinated or non-fluorinated surfactant, a crosslinker, an aqueous or organic solvent, and the like. In some example embodiments, the coating solution used to form the pattern 124 includes a low surface energy material such as a thermally or UV curable silicone "ink" and a crosslinker, or an acrylic resin and a fluorinated surfactant. In some embodiments, the coating composition used to form the pattern 124 may be combined with a conductive material such as, for example, metal particles or a silver paste ink, to make the pattern 124 of the low surface energy material itself be conductive.

The coating composition used to form the pattern 124 may be coated on the patterned layer 130 of electrically conductive material by a wide variety of printing techniques such as, for example, flexographic printing, gravure coating, offset printing, screen printing, plasma deposition, photolithography, micro-contact printing, inkjet printing or selective removal of a uniform layer of the material by laser or other etching technique, optically writing with light or a laser, electrostatic spray or by plasma treatment.

In various embodiments, the patterned layer 124 of the low energy material has a dry thickness of about 100 nm to about 10 μm. If the patterned layer 124 of the low energy material has a dry thickness of about 100 nm to about 300 nm, the patterned layer 124 may be sufficiently thin to allow some of the nanowires to protrude above the surface of the patterned layer 124, which can provide a route for electrical connection to the patterned layer 130 of electrically conductive material through the patterned layer 124.

Figure 2C:
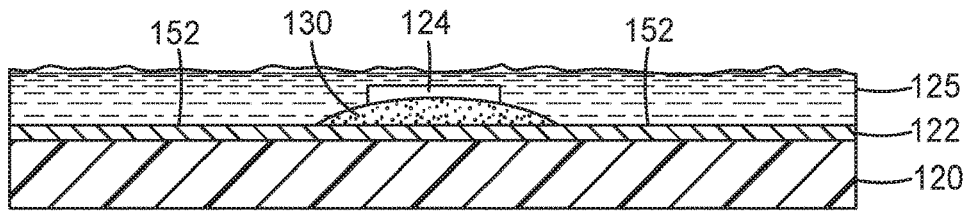

Referring now to FIG. 2C, a liquid overcoat composition 125 is coated over the conductive surface 123 of the conductive layer 122, and initially covers both the printed pattern of the low surface energy material 124 and the patterned layer of the electrically conductive material 130, as well as the second region 152 of the surface 123 that is uncoated with the patterns of the low surface energy material 124 or the patterned layer of the electrically conductive material 130.

In various embodiments, the liquid overcoat composition 125 is coated to a thickness of about 10 μm to about 15 μm. The liquid overcoat composition 125 may be applied to the conductive surface 123 using any suitable printing technique including, for example, flood coating, gravure coating, curtain coating, bead coating, offset printing, screen printing, inkjet printing, spraying, or by means of a blade, roller, or air knife.

The liquid overcoat composition 125 can include any material having a surface energy sufficiently greater than that of the low surface energy material in the pattern 124 to cause the liquid overcoat composition to dewet from the pattern 124 in a commercially useful amount of time. The speed at which the liquid overcoat composition 125 rearranges about the patterned layer 124 can impact the speed at which the predetermined areas of the conductive surface 123 can be coated in a roll-to-roll process. A discussion of the rates of recession of liquids from low surface energy materials can be found in, for example, Brouchard-Wyart and de Gennes, *Advan. Colloid Interface Sci.,* 39 (1992), which is incorporated herein by reference.

If the liquid coating composition 125 is coated as a uniform layer, it is necessary to destabilize the layer so the liquid overcoat composition separates, flows off, and withdraws from the patterned layer 124 of the low surface energy material. If the liquid overcoat composition is sufficiently dilute, or when it becomes sufficiently thin during subsequent drying steps, spontaneous dewetting from the pattern 124 to the regions 152 of the conductive surface 123 areas takes place, without the need for any active destabilization.

In some embodiments, the liquid overcoat composition 125 can include conductive particulates that can be used to form randomly arranged conductive pathways through the overcoat layer ultimately formed by curing from the liquid overcoat composition. In other embodiments, conductive or non-conductive particulates in the liquid overcoat composition 125 can be used to initiate or maintain destabilization of the liquid overcoat composition 125 so the liquid overcoat composition 125 can more easily separate, flow off and withdraw from the patterned layer 124 of the low surface energy material and the patterned layer of electrically conductive material 130. In some embodiments, the liquid overcoat composition 125 is substantially free of particulate material, which in this application means that the liquid overcoat composition includes less than about 5% by weight of conductive or non-conductive particulates, or less than about 1% by weight of conductive or non-conductive particulates, or less than about 0.5% by weight of conductive or non-conductive particulates. In some embodiments, the liquid overcoat composition 125 is free of conductive or non-conductive particulates, which means that the liquid overcoat composition includes no particulate material.

Suitable liquid overcoat compositions include a polymer, and desirably an optically clear polymer. Examples of suitable polymeric materials include, but are not limited to: polyacrylics such as polymethacrylates, polyacrylates and polyacrylonitriles, polyvinyl alcohols, polyesters (e.g., polyethylene terephthalate (PET), polyester naphthalate (PEN), and polycarbonates (PC)), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinylidene fluoride (PVDF), polytetrafluoroethylene (PTFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by DuPont Corp.).

In other embodiments, the liquid overcoat composition 125 includes a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In some embodiments, the prepolymer is photo-curable, i.e., the prepolymer polymerizes and/or cross-links upon exposure to irradiation such as, for example ultraviolet (UV) radiation.

The liquid overcoat composition 125 may optionally include a solvent (e.g., during application). Any non-corrosive solvent that can effectively solvate or disperse the polymeric overcoat material can be used, and examples include water, an alcohol, a ketone, an ether, tetrahydrofuran, hydrocarbons (e.g. cyclohexane) or an aromatic solvent (benzene, toluene, xylene, etc.). The solvent can be volatile, having a boiling point of no more than 200° C., no more than 150° C., or no more than 100° C.

In some embodiments, the liquid overcoat composition 125 may include a cross-linker, a polymerization initiator, stabilizers (including, for example, antioxidants, and UV stabilizers for longer product lifetime and polymerization inhibitors for greater shelf-life), surfactants and the like. In some embodiments, the liquid overcoat composition 125 may further include a corrosion inhibitor. In some embodiments, the liquid overcoat composition 125 is conductive, and can include a conductive polymer such as, for example, polyanilines, polythiophenes, and polydiacetylenes.

In some embodiments, the liquid overcoat composition 125 can be cured or dried to form an optically clear material. A material is considered optically clear if the light transmission of the material is at least 80% in the visible region (400 nm-700 nm). Unless specified otherwise, all the layers (including the substrate) described herein are preferably optically clear. The optical clarity of the liquid overcoat composition 125 is typically determined by a multitude of factors, including without limitation: the refractive index (RI), thickness, smoothness, consistency of the RI throughout the thickness, surface (including interface) reflection, and scattering caused by surface roughness and/or embedded particles.

In some embodiments, the liquid overcoat composition 125 includes an ink such as those available under the trade designation FLEXOCURE FORCE from Flint Group, Plymouth, Minn., as well as well as transparent varnishes from Nazdar (OP series), SolarFlex or SunBar series from Sun Chemical, and acrylate resins from Sartomer.

Figure 2D:
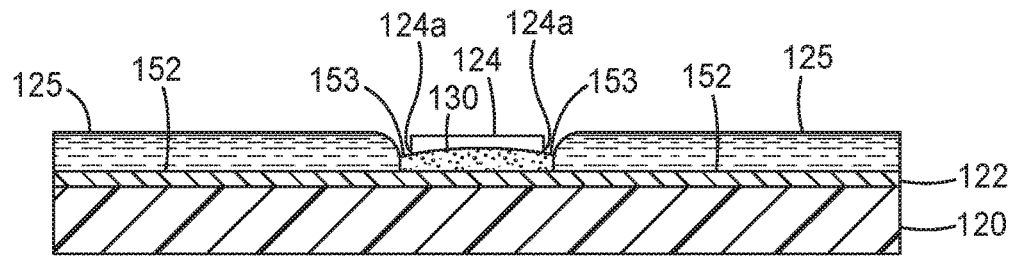

Referring now to FIG. 2D, the difference between the wettability of the patterned low surface energy layer 124 and the wettability of the conductive surface 123 and the patterned layer of electrically conductive material 130 causes instability in the liquid overcoat composition 125. This instability causes the liquid overcoat composition 125 to separate, then run off and withdraw from the patterned low surface energy layer 124. The liquid overcoat composition 125 then flows away from the patterned low surface energy layer 124 and the patterned layer of electrically conductive material 130. A first amount of the liquid overcoat composition then collects in discrete areas of the second region 152 of the conductive surface 123. The presence of the low surface energy material in the patterned layer 124 also causes the liquid overcoat composition 125 to pull away and recede from the edges 124A of the patterned layer of low surface energy material 124, leaving a second residual amount of the liquid overcoat composition 125 in the second portion 153 of the patterned layer of electrically conductive material 130 adjacent to the edges 124A.

The second residual amount of the liquid overcoat composition 125 overlying the second portion 153 of the patterned layer of electrically conductive material 130 is less than the first amount of the liquid overcoat composition 125 overlying the second region 152 of the conductive surface 123. In the embodiment shown in FIG. 2C, none of the liquid overcoat composition 125 remains in the second portion 153. In the embodiment of FIG. 2D the second portion 153 is free of and uncovered by the liquid overcoat composition 125, which leaves the patterned layer 130 of conductive material completely exposed.

In another embodiment not shown in FIG. 2D, a first amount of the liquid overcoat composition 125 does not completely recede from the second portion 153 of the patterned layer of conductive material 130. A second residual amount of the liquid overcoat composition 125 clings to the edges 124A of the patterned layer 124 and overlies the second portion 153. The thickness of the second residual amount on the second portion 153 of the patterned conductive layer 130 can vary widely depending on the relative wettability of the patterned layer 124 and the liquid overcoat composition 125, but in various embodiments the thickness of the second residual amount of the liquid overcoat composition 125 overlying the second portion 153 of the patterned conductive layer 130 is no greater than about 250 nm. Following cure, the second portion 153 of the patterned layer 130 of electrically conductive material remains uncovered by the protective layer 125A. This zone having no residual amount of the protective layer 125A effectively forms an arrangement of vias or access channels 160 that extend from above the protective layer 125A to the conductive surface 123 of the conductive nanowire layer 122. In another embodiment not shown in FIG. 2E, a very thin residual amount of the protective layer 125A with a thickness no greater than about 250 nm, or no greater than about 100 nm, or no greater than about 75 nm, or no greater than about 50 nm, or no greater than about 10 nm, or no greater than about 5 nm, remains in the second portion 153 of the patterned layer of conductive material 130. This extremely thin portion of the protective layer 25A overlying the second portion 153 forms an arrangement of vias or access channels 160 that extend from above the protective layer 125A to the surface 153 of the patterned layer of conductive material 130.

As in FIG. 1E above (not shown in FIG. 2E), a layer of an electrically conductive material can be applied in the vias 160 to provide electrical connection to selected areas of the conductive surface 123 of the conductive layer 122. However, if a very thin residual amount of the protective layer 125A with a thickness no greater than about 250 nm, or no greater than about 100 nm, or no greater than about 75 nm, or no greater than about 50 nm, or no greater than about 10 nm, or no greater than about 5 nm, remains in the second portion 153 of the patterned layer of conductive material 130, the conductive material can rest on top of the protective layer 125A and still form an electrical connection through the protective layer 125A to the conductive surface 153 of the patterned layer of conductive material 130 and to the conductive layer 122.

Figure 2E:
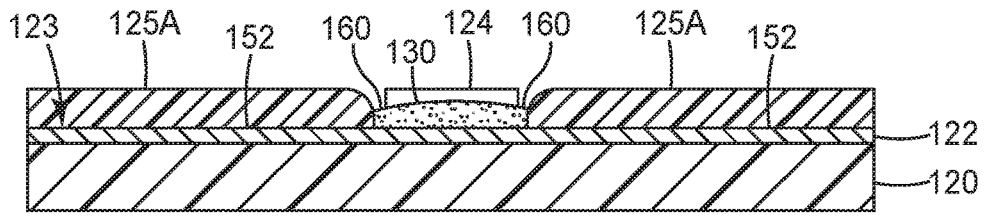

In another embodiment not shown in FIG. 2E, an electrical connection could be made to the conductive layer 122 through the vias 160 by directly bonding the metal contacts of an electrical component to the conductive layer 122. The electronic component may vary widely depending on the intended application, and in some embodiments includes a flexible circuit, a printed circuit board (PCB), a glass panel, or a pattern of wires.

As above, using the process of FIGS. 2A-2E, multiple layers can be overcoated simultaneously, and the layer structure is maintained, thus allowing perfect registration of all the layers with the patterned low energy layer 124, and further maintaining the structure of the vias 160, which allows electrical connection to the conductive layer 122.

Figure 3:
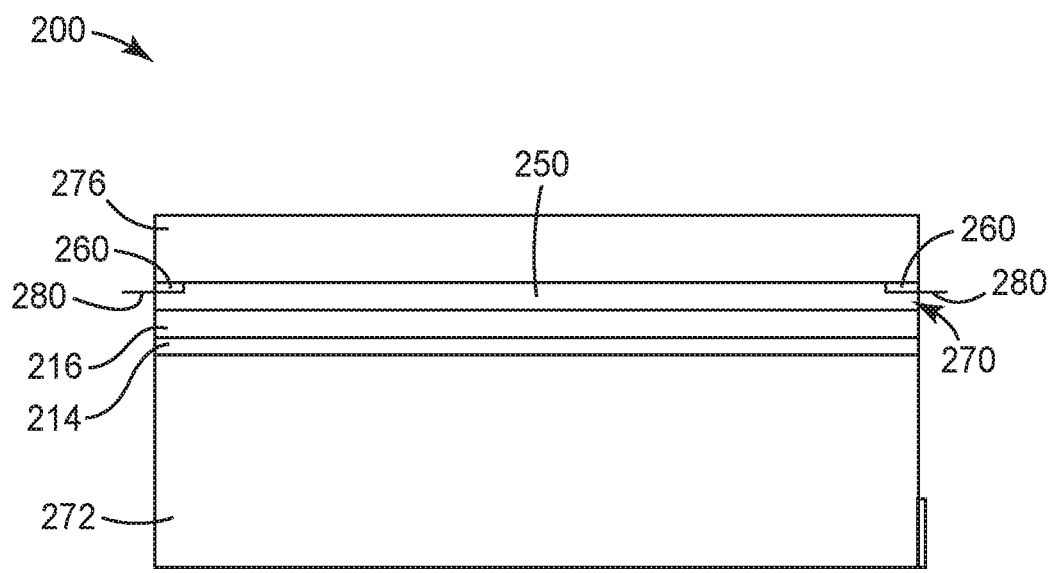
FIG. 3 is a schematic, cross-sectional view of a touch-screen display.

Referring to FIG. 3, an example of a touch-screen assembly 200 includes a LCD layer 272 adjacent to a layer of glass 214, which provides a substrate for an electronic assembly construction 270 made using the processes described above. The electronic assembly construction 270 includes a conductive layer 216, which is electrically connected to flexible circuits 260 via a conductive adhesive layer 250. Electrical traces 280 on the flexible circuits 260 connect the assembly 200 to components of a display device such as a computer, mobile phone, tablet, and the like. A flexible transparent surface 276 overlying the electronic assembly construction 270 provides a point of interaction with a user of the display device.

The processes of this disclosure will now be further described in the following non-limiting examples.

EXAMPLES

Example 1

A 50 Ohm/Sq. silver nanowire coating was prepared as described in Example 1 of WO2014088950 A1. This film was used as input to a roll-to-roll flexographic process, and a variety of patterns were printed onto the nanowire-coated side of the film, using a low surface-energy ink.

The first ink was composed of a mixture of 97.5% by weight Dow Syl-Off 7170 silicone and 2.5% by weight 7488 crosslinker. The Syl-Off silicone was printed at a speed of 5 meters/min using a 1.0 BCM/in$^2$ anilox printing roll. The Syl-off silicone was thermally cured by running it through an oven heated to 120° C. for approximately 45-60 seconds.

A second UV-curable silicone ink was printed at a speed of 5 meters/min using the 1.0 BCM/in$^2$ anilox printing roll. The UV curable silicone ink was passed through a Fusion UV Curing system equipped with an H-Bulb light source for curing.

The silicone-printed substrate was then over-coated with a mixture of 25% by weight Flint Group FC Force printing ink (Product Code: UFR0-0061-465U) in 75% by glycol ether PM, using a #5 Meyer rod, targeting an approximate 10-15 μm wet film coating (or roughly, a 2-4 μm dry-film coating).

The polymer-solvent coating was dried for 1 minute in an oven set to 80° C., and then cured using a Fusion UV System equipped with a H-bulb UV source.

Figure 4A:
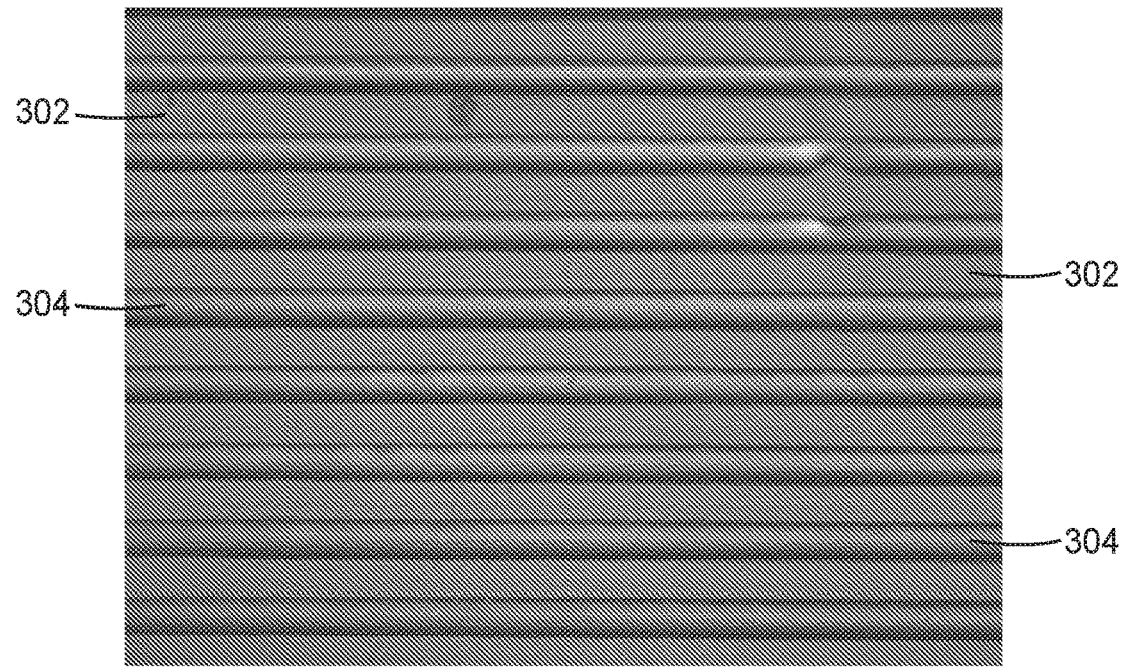
FIG. 4A is a photograph of a regular array of 500 µm pitch lines printed on a silver nanowire coating according to the procedure in Example 1.
Figure 4B:
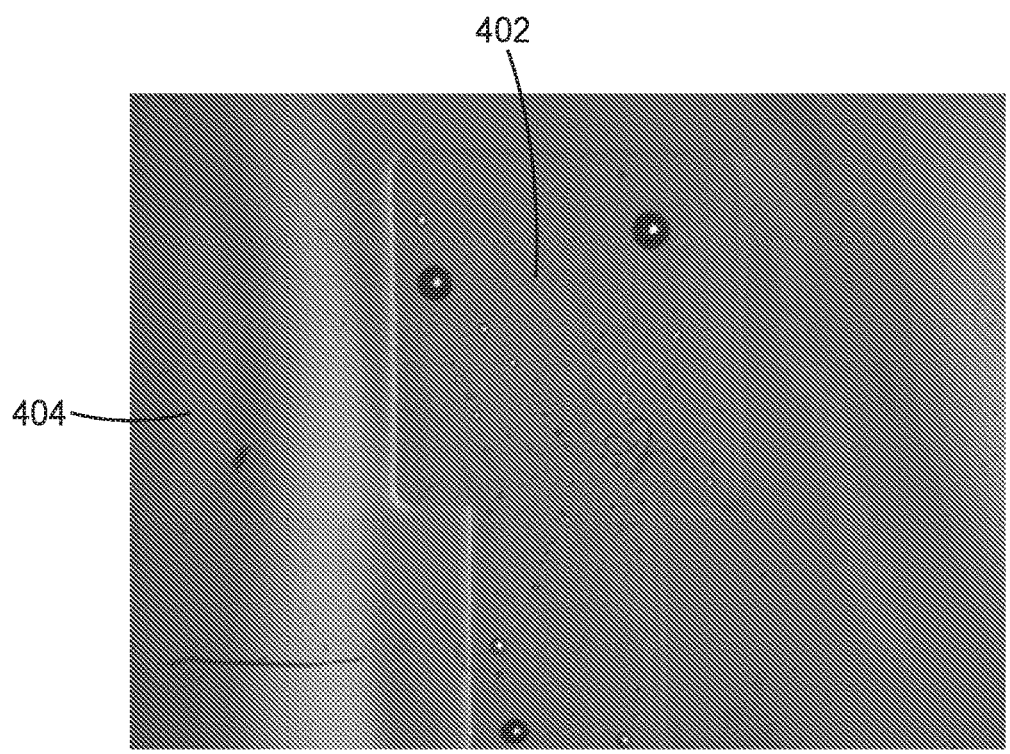
FIG. 4B is a photograph of another printed pattern produced according to Example 1, which represents the opening of a contact pad (e.g. the contact pad of a silver interconnect pattern), for which the square opening is approximately 2 mm on each side.

Immediately upon coating the polymer-solvent mixture (i.e. less than about 1-5 seconds), it dewet from the low surface-energy silicone printed features, leaving openings to the underlying silver nanowire coating. FIG. 4A shows a regular array of 500 μm pitch lines 302 that was printed on a 50 Ohm/Sq. silver nanowire coating on Dupont ST-504 PET, with corresponding dewetted over-coat layers 304. FIG. 4B demonstrates a second printed pattern 402, which represents the opening of a contact pad (e.g. the contact pad of a silver interconnect pattern), for which the square opening is approximately 2 mm on each side, and a corresponding de-wetted over-coating layer 404.

Figure 5A:
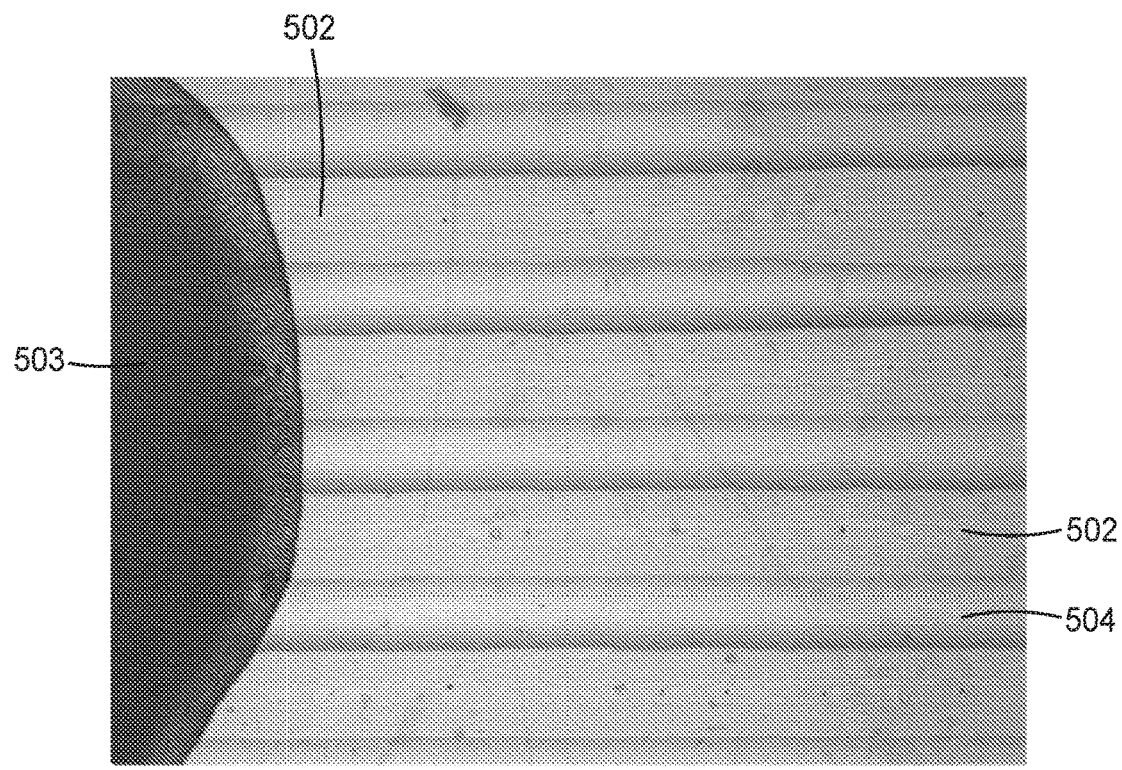
FIG. 5A is a photograph of a regular array of 500 µm pitch lines pasted on top of a patterned overcoat layer produced according to the procedure in Example 1.
Figure 5B:
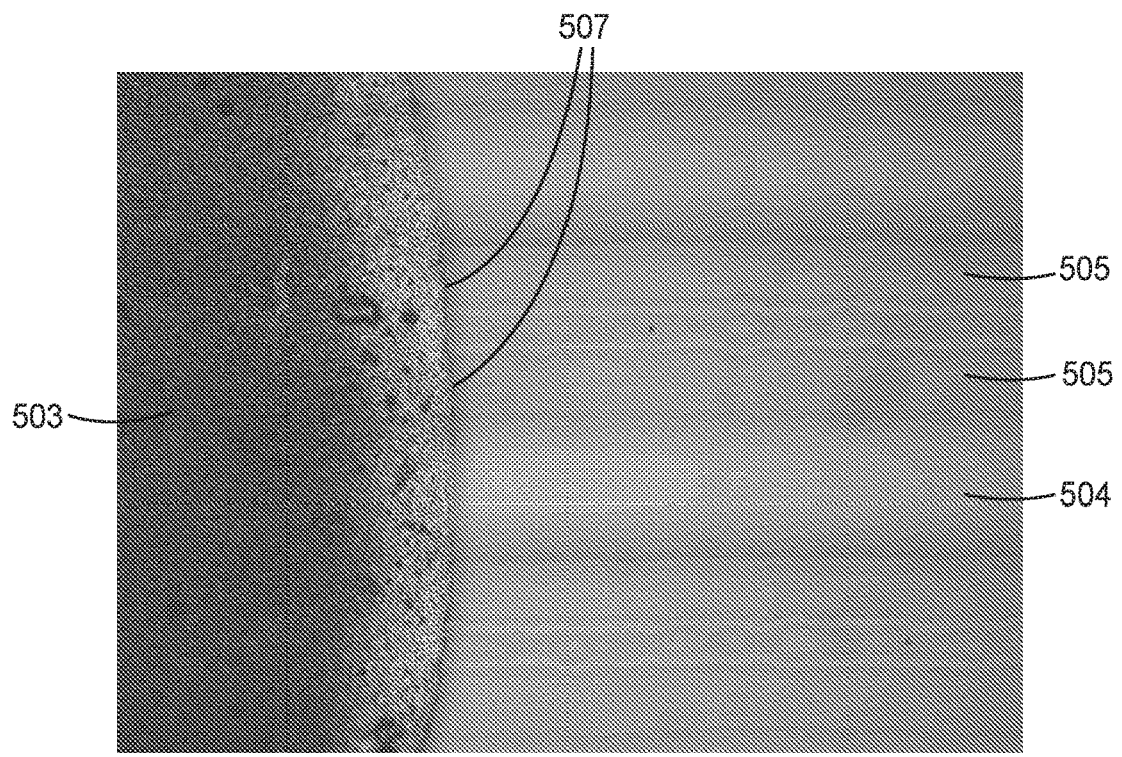
FIG. 5B is a photograph demonstrating that the silver pitch lines make contact with the underlying nanowire conductive layer in the gaps between the dewetted overcoating layer and the low surface-energy silicone print features.

PChem PFI-722 silver nanoparticle ink was applied with a small brush on top of the patterned polymer layer and underlying (and exposed) silver nanowire layer to make contact between the PChem silver pad and the underlying nanowire layer. Contact between the Pchem ink and silver nanowire substrate was determined with a volt-meter (i.e. a Fluke meter used to measure electrical resistance). FIG. 5A shows a regular array of 500 μm pitch lines 502 near a silver contact pad 503 with the PChem PFI-722 silver ink pasted on top of the pattern over-coat layer 504. As seen clearly in FIG. 5B, the PChem silver makes contact with the underlying nanowire layer 505 in contact zones 507 in the gaps between the dewetted over-coating layer and the low surface-energy silicone print features.

Example 2

A 50 Ohm/Sq. silver nanowire coating was prepared as described in Example 1 from WO2014088950 A1. A conductive silver interconnect pattern was then printed on top of the silver nanowire substrate with a desktop flexographic printing unit, using a 0.067 DPR flexographic stamp and a 10 bcm/in$^2$ anilox roll. The conductive silver ink was purchased from InkTek (Product Designation: TEC-PR-010). The printed sample was dried and cured in an oven set 120° C. for 3-5 minutes, and then removed from the oven to cool.

A silicon ink (97.5% Syl-Off 7170 with 2.5% crosslinker) was then wiped onto the surface of the printed silver interconnect pads with a small Q-tip applicator, leaving a very thin coating. The sample was then placed in an oven set to 120° C. for 1-2 minutes to cure the silicone coating.

The substrate was then over-coated with a mixture of 25% by weight Flint Group FC Force printing ink (Product Code: UFR0-0061-465U) in 75% by glycol ether PM, using a #5 Meyer rod, so as to target an approximate 10-15 μm wet film coating (or roughly, a 2-4 μm dry-film coating).

The polymer-solvent coating was dried for 1 minute in an oven set to 80° C., and then cured using a Fusion UV System equipped with a H-bulb UV source.

Figure 6:
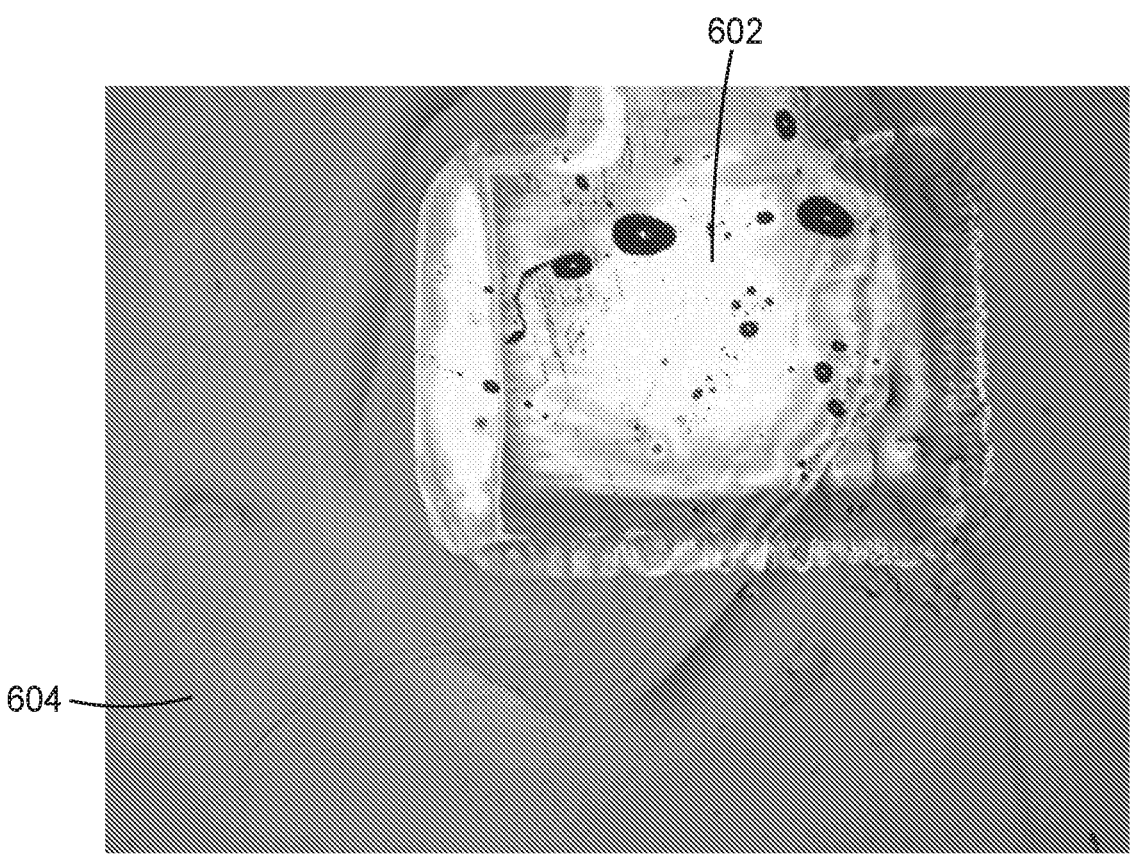
FIG. 6 is a photograph of a pad of a printed silver interconnect layer made according to the procedure of Example 2.

Referring to FIG. 6, immediately upon coating the polymer-solvent mixture (i.e. <1-5 seconds), it dewet into overcoat areas 604 from the low surface-energy silicone printed features 602, leaving openings to the underlying silver interconnect pad.

Electrical contact to the underlying silver nanowire was confirmed with a Fluke volt-meter, testing between opened interconnect pads.

Embodiment 1

A composite article, comprising:
a conductive layer on at least a portion of a flexible substrate, wherein the conductive layer comprises nanowires, and wherein the conductive layer comprises a conductive surface;
a patterned layer on a first region of the conductive surface, wherein the patterned layer comprises a low surface energy material;
an overcoat layer on a first portion of a second region of the conductive surface unoccupied by the patterned layer, wherein the overcoat layer is free of conductive particulates;
a via in a second portion of the second region of the conductive surface between an edge of the patterned layer of the low surface energy material and the overcoat layer; and
a conductive material in the via, wherein the conductive material provides an electrical connection to the conductive surface.

Embodiment 2

The composite article according to Embodiment 1, wherein the via is uncovered by the overcoat layer.

Embodiment 3

The composite article according to Embodiment 1, wherein the via is covered by the overcoat layer, and wherein the overcoat layer in the via has a thickness of no more than about 250 nm.

Embodiment 4

The composite article according to Embodiment 1, wherein the via is covered by the overcoat layer, and wherein the overcoat layer in the via has a thickness of no more than about 100 nm.

Embodiment 5

The composite article according to any of Embodiments 1 to 4, wherein the substrate is an optical element.

Embodiment 6

The composite article according to any of Embodiments 1 to 5, wherein the conductive material is selected from conductive adhesives, conductive pastes, and solder.

Embodiment 7

A composite article, comprising:
a conductive layer on at least a portion of a flexible substrate, wherein the conductive layer comprises nanowires, and wherein the conductive layer comprises a conductive surface;
a patterned conductive layer on a first region of the conductive surface, wherein a second region of the conductive surface is uncovered by the patterned conductive layer;
a patterned low surface energy layer on a first portion of the patterned conductive layer, wherein a second portion of the patterned conductive layer is uncovered by the patterned low surface energy layer;
an overcoat layer on the second region of the conductive surface, wherein the overcoat layer is free of conductive particulates;
a via between the overcoat layer and first portion of the patterned conductive layer, wherein the via overlies the second portion of the patterned conductive; and
a conductive material in the via, wherein the conductive material provides an electrical connection to the patterned conductive layer and the conductive surface.

Embodiment 8

The composite article according to Embodiment 7, wherein the via is uncovered by the overcoat layer.

Embodiment 9

The composite article according to Embodiment 7, wherein the via is covered by the overcoat layer, and wherein the overcoat layer in the via has a thickness of no more than about 250 nm.

Embodiment 10

The composite article according to Embodiment 7, wherein the via is covered by the overcoat layer, and wherein the overcoat layer in the via has a thickness of no more than about 100 nm.

Embodiment 11

The composite article according to any of Embodiments 7 to 10, wherein the substrate is an optical element.

Embodiment 12

The composite article according to any of Embodiments 7 to 11, wherein the conductive material is selected from conductive adhesives, conductive pastes, and solder.

Embodiment 13

A touch screen display comprising:
a liquid crystal display;
a composite article according to any of claims 1 to 12; and
a flexible transparent surface overlying the electronic assembly.

Embodiment 14

A method of forming a composite article, comprising:
coating a patterned layer comprising a low surface energy material onto a first region of a conductive surface disposed on a flexible substrate, wherein the conductive layer comprises nanowires, and wherein a second region of the conductive surface remains uncovered by the patterned layer;
coating a layer of a liquid overcoat composition over the patterned layer of the low energy material and the second regions of the conductive surface, wherein the liquid overcoat composition has a surface energy different from the surface energy of the low surface energy material;

de-wetting the liquid overcoat composition from the patterned layer of the low surface energy material such that the liquid overcoat composition withdraws from the patterned layer of the low surface energy material and a first amount of the liquid overcoat composition collects in a first portion of the second region of the conductive surface, wherein the liquid overcoat composition recedes from an edge of the patterned layer of the low surface energy material such that a second residual amount of the liquid overcoat composition less than the first amount remains in a second portion of the second region of the conductive surface adjacent to the edge of the patterned layer of the low surface energy material;

curing the liquid overcoat composition to form a discontinuous overcoat layer in the first portion of the second region of the conductive surface and a via in the second portion of the second region of the conductive surface, wherein the via is adjacent to the edge of the patterned layer of the low surface energy material; and electrically contacting the conductive surface through the via.

Embodiment 15

The method according to Embodiment 14, wherein the via is uncovered by the overcoat layer.

Embodiment 16

The method according to Embodiment 14, wherein the via is covered by the overcoat layer, and wherein the overcoat layer in the via has a thickness of no more than about 250 nm.

Embodiment 17

The method according to Embodiment 14, wherein the via is covered by the overcoat layer, and wherein the overcoat layer in the via has a thickness of no more than about 100 nm.

Embodiment 18

The method according to Embodiment 14, wherein the overcoat layer is free of electrically conductive particulates.

Embodiment 19

The method according to any of Embodiments 14 to 18, wherein the substrate comprises a polymeric film.

Embodiment 20

The method according to any of Embodiments 14 to 19, wherein the substrate is an optical element.

Embodiment 21

The method according to Embodiment 20, wherein the optical element comprises a multilayer optical film.

Embodiment 22

The method according to any of Embodiments 14 to 21, wherein the low surface energy material comprises a silicone or an acrylic.

Embodiment 23

The method according to Embodiments 22, wherein the low surface energy material comprises a thermally cured silicone or an ultraviolet (UV) cured silicone.

Embodiment 24

The method according to Embodiment 22, wherein the low surface energy material comprises an acrylic and a fluorinated surfactant.

Embodiment 25

The method according to any of Embodiments 14 to 24, wherein the low surface energy material is patterned by at least one of flexographic printing, gravure printing, ink jet printing, or screen printing.

Embodiment 26

The method according to any of Embodiments 14 to 25, wherein the low surface energy material is conductive.

Embodiment 27

The method according to any of Embodiments 14 to 26, wherein the electrically contacting the conductive layer in the via comprises applying a conductive material in the via, wherein the conductive material is selected from conductive adhesives, conductive pastes, solder, and combinations thereof.

Embodiment 28

The method according to any of Embodiments 14 to 27, wherein the protective overcoat composition comprises a UV-curable resin.

Embodiment 29

An electronic assembly made according to the method of any of Embodiments 14 to 28.

Embodiment 30

A method of forming a composite article, comprising:
coating a first patterned layer of a conductive material on a first region of a conductive surface on a conductive layer disposed on a flexible substrate, wherein the conductive layer comprises nanowires, and wherein a second region of the conductive surface is uncoated by the first patterned layer of the conductive material;
coating a second patterned layer of a low surface energy material on a first portion of the first patterned layer of the conductive material, wherein a second portion of the first patterned layer is uncoated by the second patterned layer;
coating a layer of a liquid overcoat composition onto the first and the second regions of the conductive surface, wherein the liquid overcoat composition has a surface energy greater than the surface energy of the low surface energy material in the second patterned layer;

de-wetting the liquid overcoat composition from the second patterned layer of the low surface energy material such that a first amount of the liquid overcoat composition withdraws from the second patterned layer and collects in the second region of the conductive surface, and wherein a second amount of the liquid overcoat composition less than the first amount remains in the second portion of the first patterned layer of the conductive material;

curing the liquid overcoat composition to form a discontinuous overcoat layer in the second region of the conductive surface, wherein the overcoat layer is separated from the second patterned layer by a via overlying the second portion of the first patterned layer; and electrically contacting the second portion of the first patterned layer through the via.

Embodiment 31

The method according to Embodiment 30, wherein the via is uncovered by the overcoat layer.

Embodiment 32

The method according to Embodiment 30, wherein the via is covered by the overcoat layer, and wherein the overcoat layer in the via has a thickness of no more than about 250 nm.

Embodiment 33

The method according to Embodiment 30, wherein the via is covered by the overcoat layer, and wherein the overcoat layer in the via has a thickness of no more than about 100 nm.

Embodiment 34

The method according to Embodiment 30, wherein the overcoat layer is free of electrically conductive particulates.

Embodiment 35

The method according to any of Embodiments 30 to 34, wherein the substrate comprises a polymeric film.

Embodiment 36

The method according to any of Embodiments 30 to 35, wherein the substrate is an optical element.

Embodiment 37

The method according to Embodiment 36, wherein the optical element comprises a multilayer optical film.

Embodiment 38

The method according to any of Embodiments 30 to 37, wherein the low surface energy material comprises a silicone or an acrylic.

Embodiment 39

The method according to Embodiment 38, wherein the low surface energy material comprises a thermally cured silicone or an ultraviolet (UV) cured silicone.

Embodiment 40

The method according to Embodiment 38, wherein the low surface energy material comprises an acrylic and a fluorinated surfactant.

Embodiment 41

The method according to any of Embodiments 30 to 40, wherein the low surface energy material is patterned by at least one of flexographic printing, gravure printing, ink jet printing, or screen printing.

Embodiment 42

The method according to any of Embodiments 30 to 41, wherein the low surface energy material is conductive.

Embodiment 43

The method according to any of Embodiments 30 to 42, wherein the electrically contacting the conductive layer in the via comprises applying a conductive material in the via, wherein the conductive material is selected from conductive adhesives, conductive pastes, solder, and combinations thereof.

Embodiment 44

The method according to any of Embodiments 30 to 43, wherein the protective overcoat composition comprises a UV-curable resin.

Embodiment 45

An electronic assembly made according to the method of any of Embodiments 30 to 44.

Various embodiments of the invention have been described. These and other embodiments are within the scope of the following claims.

The invention claimed is:

1. A method of forming a composite article, comprising:
coating and curing a UV curable silicone ink in combination with a crosslinker, or coating and curing an acrylic resin in combination with a fluorinated surfactant, to form a patterned layer of cured low surface energy material with a surface energy of less than about 100 mJ/m$^2$ on-a first region of a conductive surface disposed on a flexible substrate, wherein the flexible substrate is comprised of polyethylene terephthalate, polyester naphthalate, polycarbonate, linear polyolefins, branched polyolefins, cyclic polyolefins, polyvinyl chloride, polyvinylidene chloride, polyvinyl acetals, polystyrene, polyacrylates, cellulose triacetate, cellulose acetate, polyethersulphone, polyimides, and silicones, further wherein the conductive surface comprises nanowires, and additionally wherein a second region of the conductive surface remains uncovered by the patterned layer;

coating a layer of a liquid overcoat composition over the patterned layer of the low surface energy material and the second region of the conductive surface, wherein the liquid overcoat composition has a surface energy greater than the surface energy of the low surface energy material, further wherein the liquid overcoat composition is free of conductive particulates;

de-wetting the liquid overcoat composition from the patterned layer of the cured low surface energy material such that the liquid overcoat composition withdraws from the patterned layer of the cured low surface energy material and a first amount of the liquid overcoat composition collects in a first portion of the second region of the conductive surface, wherein the liquid overcoat composition recedes from an edge of the patterned layer of the cured low surface energy material such that a second amount of the liquid overcoat composition less than the first amount remains in a second portion of the second region of the conductive surface adjacent to the edge of the patterned layer of the cured low surface energy material, further wherein the second amount of the liquid overcoat composition has a thickness no greater than about 250 nm;

curing by irradiation with ultraviolet (UV) light the liquid overcoat composition to form a discontinuous overcoat layer in the first portion of the second region of the conductive surface and a via in the second portion of the second region of the conductive surface, wherein the via is adjacent to the edge of the patterned layer of the cured low surface energy material; and electrically contacting the conductive surface through the via.

2. The method according to claim 1, wherein the discontinuous overcoat layer comprises non-electrically-conductive particulates.

* * * * *